United States Patent
Sako

(10) Patent No.: US 8,406,057 B2
(45) Date of Patent: Mar. 26, 2013

(54) NONVOLATILE SEMICONDUCTOR STORAGE DEVICE

(75) Inventor: Mario Sako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 13/081,868

(22) Filed: Apr. 7, 2011

(65) Prior Publication Data

US 2011/0249508 A1 Oct. 13, 2011

(30) Foreign Application Priority Data

Apr. 9, 2010 (JP) .................. 2010-090888

(51) Int. Cl.
G11C 11/34 (2006.01)

(52) U.S. Cl. .................. 365/185.21

(58) Field of Classification Search ............. 365/185.21
See application file for complete search history.

(56) References Cited

U.S. PATENT DOCUMENTS 6,141,269 A * 10/2000 Shiomi et al. ............ 365/200
6,314,037 B1 * 11/2001 Shiomi et al. ............ 365/203
2011/0075485 A1 * 3/2011 Fukuda et al. ......... 365/185.17

FOREIGN PATENT DOCUMENTS

JP 2009-43357 2/2009

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a semiconductor storage device includes a memory string, a bit line, a sense simplifier, a first MOS, a first charging-circuit, a second-charging circuit, and a controller. The memory string includes memory cells. The bit line is connected to the memory cell. The sense amplifier applies a voltage to the bit line. The first MOS is electrically connected between the sense amplifier and bit line. The first charging circuit has a first current supply capacity and transfers a first current. The second charging-circuit has a second current supply capacity. The controller controls a first timing to switch from the first current to the second current.

19 Claims, 6 Drawing Sheets

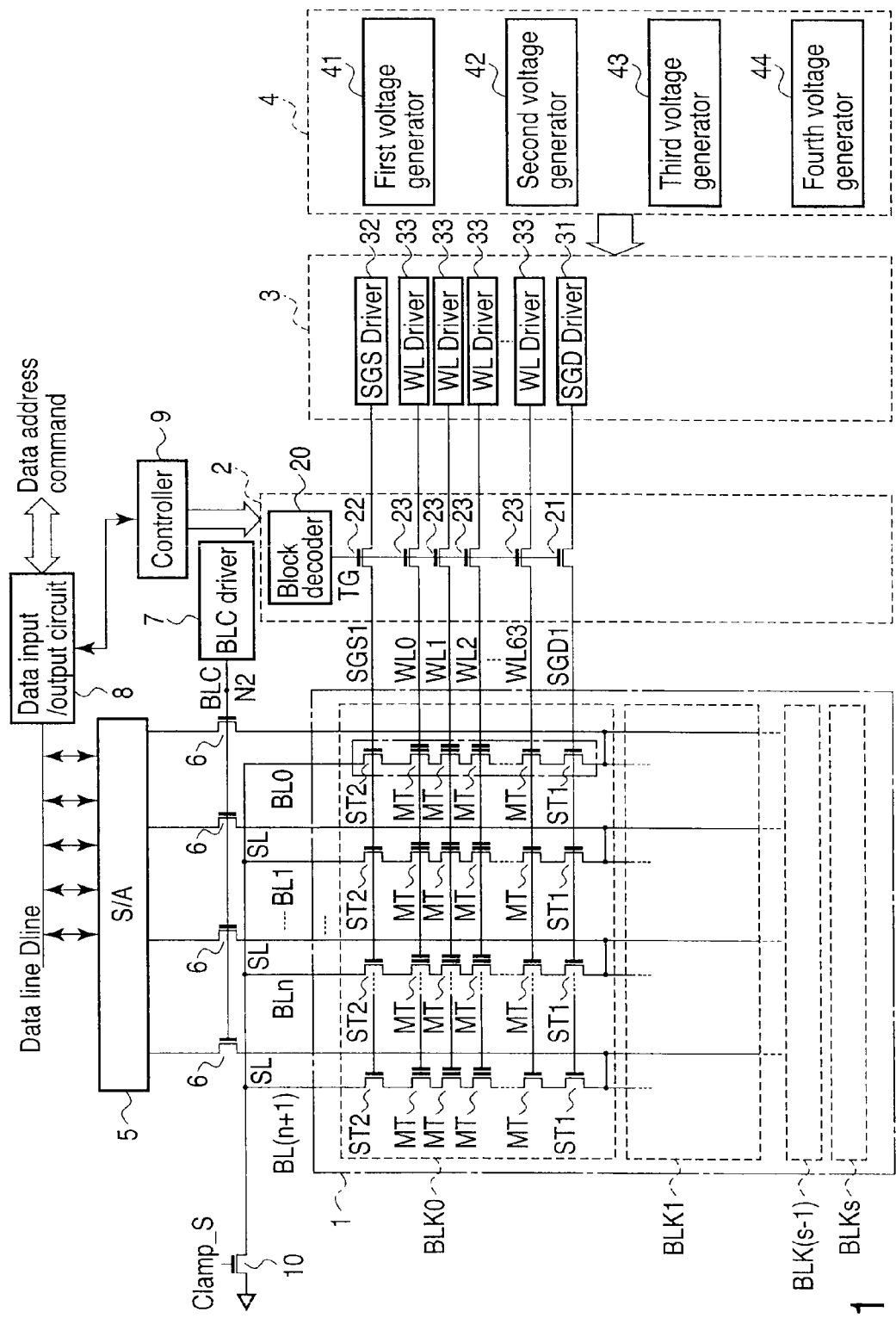
F I G. 1

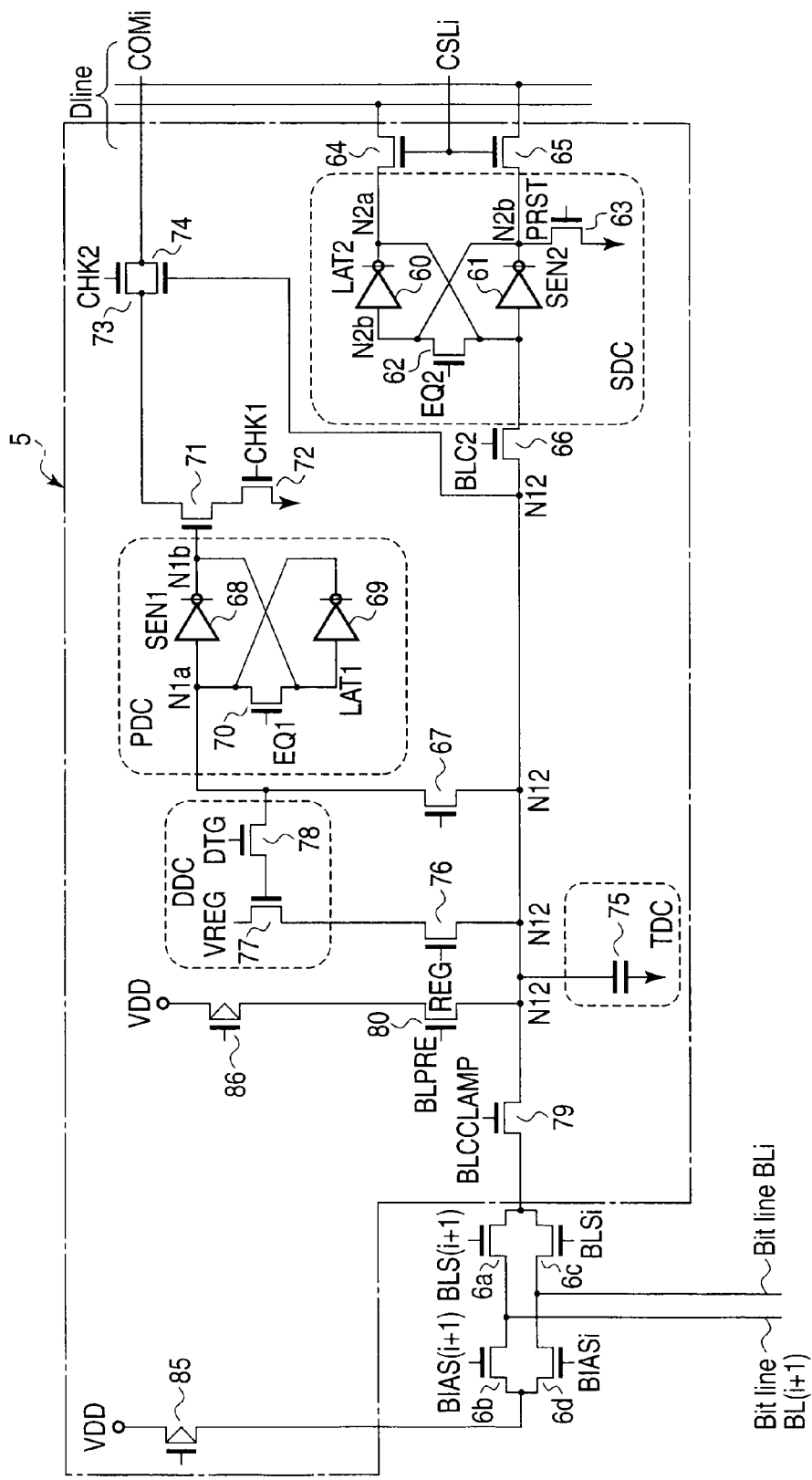
F I G. 4

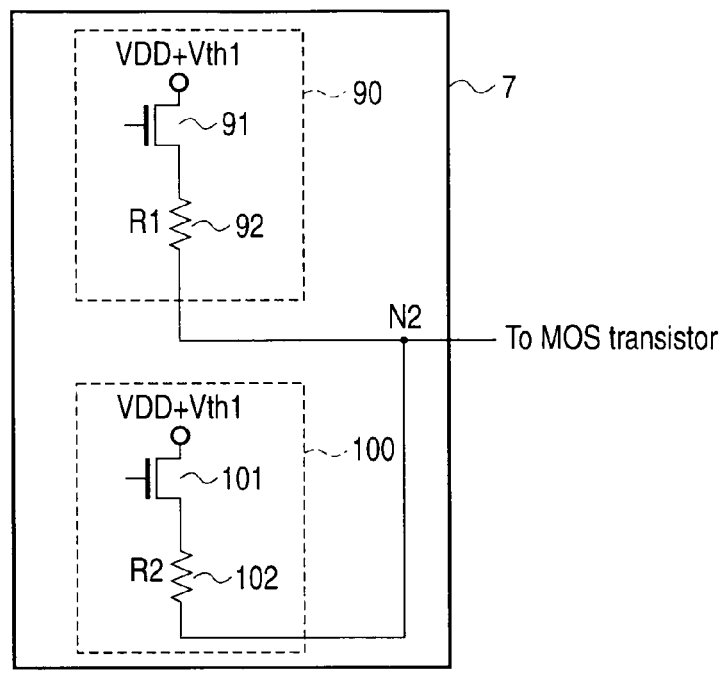
F I G. 5
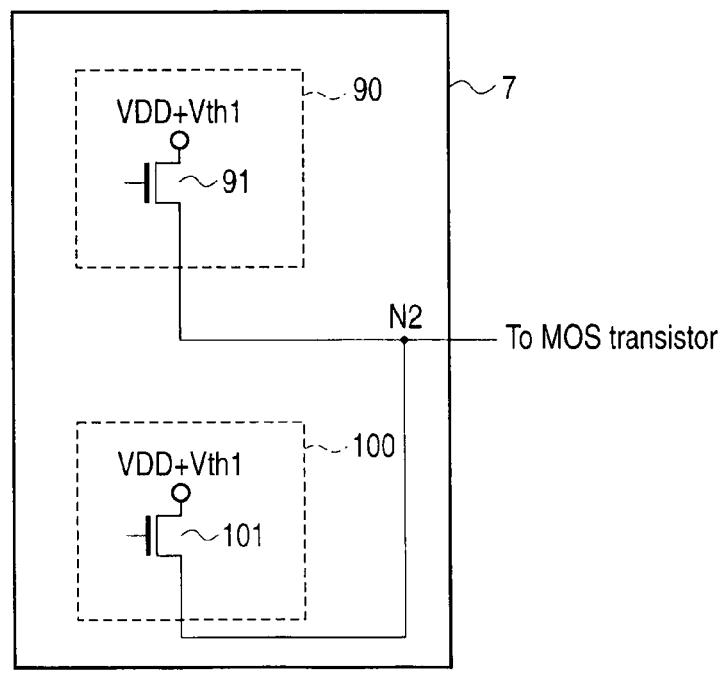
F I G. 6

NONVOLATILE SEMICONDUCTOR STORAGE DEVICE

CROSS-REFERENCE TO RELATED APPLICATIONS

This application is based upon and claims the benefit of priority from Japanese Patent Application No. 2010-090888, filed Apr. 9, 2010; the entire contents of which are incorporated herein by reference.

FIELD

Embodiments described herein relate generally to a nonvolatile semiconductor storage device.

BACKGROUND

When writing and reading data to and from a NAND flash memory, it is required to first charge a bit line with a voltage.

However, a current, which flows to the bit line, has a waveform having a high peak (hereinafter, a peak current) with increase in voltage of the bit line by a sense amplifier. Because of this, a voltage in an input/output buffer connected to the sense amplifier for inputting and outputting the data at a high clock rate decreases, so that operation is unstable when inputting the data from outside or when outputting the data outside.

Further, for a device using the NAND flash memory, noise generated by the current, which flows to the bit line, deteriorates the operational reliability.

When making the increase in the current, which flows to the bit line, slower in order to inhibit the noise and the above-described decrease in voltage, there is a problem that high-speed operation cannot be realized.

BRIEF DESCRIPTION OF THE DRAWINGS

FIG. 1 is a block diagram of a NAND flash memory according to a first embodiment;

FIG. 4 is a block diagram of a sense amplifier and a charging circuit according to the first embodiment;

FIGS. 5 and 6 are block diagrams of a BLC driver according to the first embodiment;

DETAILED DESCRIPTION

Figure 2:
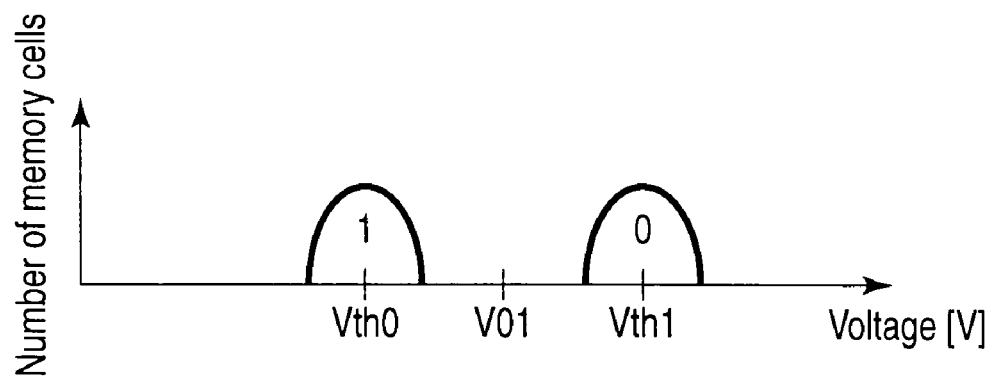
FIG. 2 is threshold distribution of memory cells according to the first embodiment.

Hereinafter, first and second embodiments will be described with reference to the drawings. In this description, common reference numerals are assigned to common parts throughout the drawings.

First Embodiment

In general, according to one embodiment, a nonvolatile semiconductor storage device includes a memory string, a bit line, a sense simplifier, a first MOS transistor, a first charging circuit, a second charging circuit, and a controller. The memory string includes a plurality of memory cells. Each of the memory cells is capable of holding data. The bit line is connected to the memory string. The sense amplifier applies a voltage to the bit line to read and write the data from and to the memory cell. The first MOS transistor is electrically connected between the sense amplifier and the bit line. The first charging circuit has a first current supply capacity and transfers a first current to a gate of the first MOS transistor through a first node. The second charging circuit has a second current supply capacity higher than the first current supply capacity and transfers a second current larger than the first current to the gate of the first MOS transistor through the first node. The controller controls a first timing to switch from the first current to the second current.

A nonvolatile semiconductor memory according to the first embodiment will be described with reference to FIG. 1. FIG. 1 is a block diagram of a NAND flash memory according to this embodiment. The NAND flash memory according to this embodiment is configured to prevent delay of bit line charge by transfer of currents having different current supply capacities to the gate of the MOS transistor to which the bit line and the sense amplifier are connected by a bit line cramp driver (hereinafter, a BLC driver) when writing and reading the data. Also, in this embodiment, a voltage lower than in the past (for example, an internal voltage VDD) is used in the BLC driver, which generates the above-described currents. That is, the nonvolatile semiconductor storage device according to this embodiment is configured to prevent the delay of the bit line charge while suppressing power consumption.

Configuration Example

As illustrated in FIG. 1, the NAND flash memory includes a memory cell array 1, a row decoder 2, a driver circuit 3, a voltage generator 4, a sense amplifier 5, a MOS transistor 6, a BLC driver 7, a data input/output circuit 8, a controller 9, and an re-channel MOS transistor 10. First, the memory cell array 1 will be described.

<Configuration Example of Memory Cell Array 1>

The memory cell array 1 includes a plurality of nonvolatile memory cell transistors MT capable of holding the data. The memory cell transistor MT is the n-channel MOS transistor provided with a stacked gate including the charge storage layer and the control gate, for example. The control gate of the memory cell transistor MT serves as a word line, a drain thereof is electrically connected to the bit line and a source thereof is electrically connected to a source line. The memory cell array 1 includes blocks BLK0 to BLKs (s is a natural number) including a plurality of nonvolatile memory cell transistors MT.

As illustrated, each of the blocks BLK0 to BLKs includes a plurality of NAND strings 11 in which current pathways of the nonvolatile memory cell transistors MT are connected in series. Each of the NAND strings 11 includes 64 memory cell transistors MT, for example, and selection transistors ST1 and ST2. The memory cell transistor MT has an FG structure including the charge storage layer (floating gate: conductive layer) formed on a semiconductor substrate with a gate insulating film interposed therebetween, an interlayer insulating film formed on the floating gate, and further a control gate electrode formed on a layer of the interlayer insulating film. Meanwhile, the memory cell transistor MT may also have a MONOS structure. The MONOS structure includes the charge storage layer (for example, an insulating film) formed on the semiconductor substrate with the gate insulating film interposed therebetween, an insulating film (hereinafter, referred to as a block layer) of which a dielectric constant is higher than that of the charge storage layer and which is formed on the charge storage layer, and further the control gate electrode formed on the block layer. Meanwhile, the number of the memory cell transistors MT is not limited to 64, and may be 128, 256, 512, and the like. Also, adjacent memory cell transistors MT include the source and the drain in common. They are arranged between the selection transistors ST1 and ST2 such that the current pathways thereof are connected in series. A drain region on one end side of the memory cell transistors MT connected in series is connected to a source region of the selection transistor ST1 and a source region on the other end side thereof is connected to a drain region of the selection transistor ST2.

Control gate electrodes of the memory cell transistors MT on the same row are connected in common to any one of word lines WL0 to WL63, and gate electrodes of the selection transistors ST1 and ST2 of the memory cell transistors MT on the same row are connected in common to select gate lines SGD1 and SGS1, respectively. Meanwhile, in order to simplify the description, there is a case in which the word lines WL0 to WL63 are hereinafter simply referred to as the word lines WL when they are not distinguished from one another. Also, in the memory cell array 1, drains of the selection transistors ST1 on the same column are connected in common to any one of bit lines BL0 to BLn. Hereinafter, as for the bit lines BL0 to BLn also, they are collectively referred to as the bit lines BL (n: natural number) when they are not distinguished from one another. Sources of the selection transistors ST2 are connected in common to a source line SL. As for the blocks BLK0 to BLKs also, they are collectively referred to as the blocks BLK when they are not distinguished from one another.

Also, the data is collectively written in a plurality of memory cell transistors MT connected to the same word line WL and this unit is referred to as a page. Further, the data is collectively erased from a plurality of NAND strings 11 in a block BLK unit.

<Regarding Threshold Distribution of Memory Cell Transistors MT>

Next, a threshold distribution of the above-described memory cell transistors MT will be described with reference to FIG. 2. FIG. 2 is a graph in which the threshold distribution is represented along an abscissa axis and the number of memory cell transistors MT is represented along a longitudinal axis.

As illustrated, each of the memory cell transistors MT is capable of holding 2-level data (1-bit data), for example. That is, the memory cell transistor MT is capable of holding two types of data, which are "1" and "0", in ascending order of a threshold voltage Vth.

A threshold voltage Vth0 of the "1" data in the memory cell transistor MT satisfies Vth0<V01. A threshold voltage Vth1 of the "0" data satisfies V01<Vth1. In this manner, the memory cell transistor MT is capable of holding the 1-bit data, which are the "0" data and the "1" data, according to a threshold. The threshold voltage varies by injection of charge to the charge storage layer. It is also possible that the above-described memory cell transistor MT is capable of holding 4-or-more-level data.

<Regarding Row Decoder 2>

Next, the row decoder 2 will be described with reference to FIG. 1 again. The row decoder 2 includes a block decoder 20 and n-channel MOS transistors 21 to 23. First, the block decoder 20 will be described.

The block decoder 20 decodes a block address given from the controller 9 at the time of a write operation, read operation, and erasing of the data, and selects the block BLK based on a result. That is, the block decoder 20 selects a control line TG to which the MOS transistors 21 to 23 corresponding to the block BLK in which a selected memory cell transistor MT is included is connected, thereby turning on the MOS transistors 21 to 23.

At this time, a block selection signal is output from the block decoder 20. The block selection signal is the signal with which the row decoder 2 selects any one of a plurality of memory blocks BLK0 to BLKs when reading, writing, and erasing the data. That is, the row decoder 2 selects a row direction of the memory cell array 1 corresponding to a selected block BLK. In other words, the row decoder 2 applies a voltage applied from the driver circuit 3 to the select gate lines SGD1 and SGS1 and the word lines WL0 to WL63 based on the selection signal given from the block decoder 20.

<Regarding Driver Circuit 3>

Next, the driver circuit 3 will be described. The driver circuit 3 includes select gate line drivers 31 and 32 provided for each of the select gate lines SGD1 and SGS1, respectively, and word line drivers 33 provided for each of the word lines WL. In this embodiment, only the word line drivers 33 and the select gate line drivers 31 and 32 corresponding to the block BLK0 are illustrated. However, actually, the word line drivers 33 and the select gate line drivers 31 and 32 are connected in common to the 64 word lines WL, for example, and the select gate lines SGD1 and SGS1 provided on each of the block BLK0 to the block BLKs.

When the block BLK is selected according to a decode result of a row address (page address) given from the controller 9, the select gate line driver 31 transfers a required voltage to a gate of the selection transistor ST1 through the select gate line SGD1 corresponding to the block BLK. At this time, the select gate line driver 31 transfers the voltage corresponding to L level or H level to the gate of the selection transistor ST1 as a signal sgd.

That is, when writing, reading, erasing, and further verifying the data in the memory cell transistor MT, the select gate line driver 31 transfers the voltage corresponding to the "H" level or the "L" level to the gate of the selection transistor ST1 as the signal sgd, for example, through the select gate line SGD1. Meanwhile, in the signal sgd, the "L" level is set to 0 [V] and the "H" level is set to the voltage VDD (for example, 1.8 [V]).

Also, when the block BLK is selected as in the case of the select gate line driver 31, the select gate line driver 32 transfers the required voltage to a gate of the selection transistor ST2 through the select gate line SGS1 when writing, reading, and further verifying the data in the memory cell transistor MT. At this time, the voltage corresponding to the L level or the H level is transferred to the gate of the selection transistor ST2 as a signal sgs. Meanwhile, in the signal sgs, the "L" level is set to 0 [V] and the "H" level is set to the voltage VDD.

Further, when the block BLK is selected according to the decode result of the row address (page address) given from the controller 9, the word line driver 33 transfers a voltage required in each operation (such as voltages VPGM, VPASS, and VREAD to be described later) to the control gate of the memory cell transistor MT through a selected word line WL.

<Regarding Voltage Generating Circuit 4>

Next, the voltage generator 4 will be described. As illustrated, the voltage generator 4 includes a first voltage generator 41, a second voltage generator 42, a third voltage generator 43, and a fourth voltage generator 44. The first voltage generator 41 to the fourth voltage generator 44 will be described with reference to FIG. 3.

Figure 3:
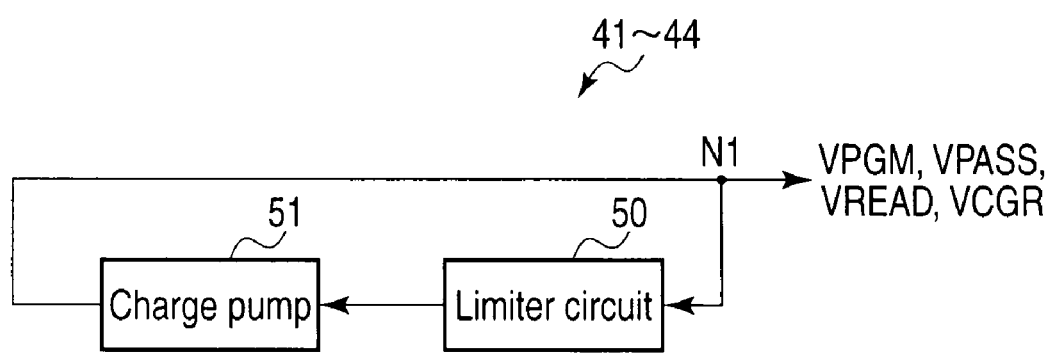
FIG. 3 is a block diagram of a voltage generator according to the first embodiment.

As illustrated in FIG. 3, each of the first voltage generator 41 to the fourth voltage generator 44 includes a limiter circuit 50 and a charge pump circuit 51. The charge pump circuit 51 generates the voltage required in the write operation and the read operation of the data, for example, by the controller 9. Each of the above-described generated voltages is output from a node N1 to be supplied to the row decoder 2, for example, in the NAND flash memory through the driver circuit 3. The limiter circuit 50 controls the charge pump circuit 51 according to the potential of the node N1 while monitoring the potential of the node N1. That is, when the potential of the node N1 is higher than a predetermined value, the limiter circuit 50 stops pumping of the charge pump circuit 51 to decrease the potential of the node N1. When the potential of the node N1 is lower than the predetermined value, this instructs the charge pump circuit 51 to pump, thereby increasing the potential of the node N1.

Next, the voltage generated by the above-described first voltage generator 41 to the fourth voltage generator 44 will be described. The first voltage generator 41 generates the voltage VPGM when writing the data to transfer the voltage VPGM to the selected word line WL. The voltage VPGM is the voltage having a magnitude such that the charge of a channel of the memory cell transistor MT is injected to the charge storage layer and the threshold of the memory cell transistor MT transits to another level.

The second voltage generator 42 generates the voltage VPASS to transfer the voltage VPASS to a non-selected word line WL. The voltage VPASS is the voltage at which the memory cell transistor MT is turned on.

The third voltage generator 43 generates the voltage VREAD when reading the data to transfer the voltage VREAD to the non-selected word line. The voltage VREAD is the voltage to turn on the memory cell transistor MT regardless of held data.

The fourth voltage generator 44 generates the voltage VCGR when reading the data to transfer the voltage VCGR to the selected word line WL. The voltage VCGR is the voltage corresponding to the data to be read from the memory cell transistor MT. The voltage VCGR is also used as a write verify voltage. That is, a desired write verify voltage is set by setting the voltage VCGR to a certain constant value. By the voltage VCGR, it may be confirmed that, when the memory cell transistor MT is turned on, the threshold voltage of the memory cell transistor MT is lower than the set write verify voltage, and on the other hand, when the memory cell transistor MT is turned off, this is higher than the verify voltage. The write verify voltage is controlled by the limiter circuit 50. That is, the write verify voltage may be separately set according to the threshold distribution of the memory cell transistors MT. Meanwhile, when the above-described first voltage generator 41 to fourth voltage generator 44 are not distinguished from one another, they are simply referred to as the voltage generators 4.

<Regarding Sense Amplifier 5>

Next, the sense amplifier 5 will be described. The sense amplifier 5 according to this embodiment serves as a voltage detection type sense amplifier (hereinafter, a sense method using this technique is also referred to as a voltage sense).

When reading the data, the sense amplifier 5 senses the data read from the bit line BL connected to the memory cell transistor MT, which is a read target, (bit line BL, which is the read target) to amplify. Specifically, the sense amplifier 5 pre-charges the bit line BL, which is the read target, at a predetermined voltage (for example, the voltage VDD), and thereafter allows the NAND string 11 selected by the row decoder 2 to discharge the bit line BL and senses a discharge state of the bit line BL. That is, the sense amplifier 5 amplifies the voltage of the bit line BL to sense the data of the memory cell transistor MT. The read data is transferred to the data input/output circuit 8 through a data line $D_{line}$. Meanwhile, at this time, the voltage of the bit line BL, which is not the read target, is fixed at the voltage VDD.

When writing the data, the sense amplifier 5 transfers write data to the bit line BL, which is a write target. Specifically, when writing the "1" data, a predetermined voltage (for example, the voltage VDD) is transferred to the bit line BL, and when writing the "0" data, 0 V is transferred, for example, to the bit line BL. Meanwhile, at this time, the voltage of the bit line BL, which is not the read target, is fixed at the voltage VDD.

In this manner, the data is read and written for one of two adjacent bit lines BL. Groups of the two adjacent bit lines BL include a group of the bit line BL0 and the bit line BL1, a group of the bit line BL2 and the bit line BL3, a group of the bit line BL4 and the bit line BL5, and so on. That is, the reading and the writing are collectively performed for n/2 bit lines BL out of n bit lines BL. Hereinafter, out of one group of the bit lines BL, the bit line BL, which is the read target or the write target, is referred to as a selected bit line BL and the bit line BL, which is not the target, is referred to as a non-selected bit line BL.

Next, a configuration of the sense amplifier 5, which serves as the above-described voltage detection type, and the MOS transistor 6 will be described with reference to FIG. 4.

<Configuration Example of Sense Amplifier 5 and MOS Transistor 6>

As illustrated in FIG. 4, the sense amplifier 5 includes a primary data cache (PDC), a secondary data cache (SDC), a dynamic data cache (DDC), and a temporary data cache (TDC). The SDC, the PDC, and the DDC hold the input data when writing, hold the read data when reading, temporarily hold the data when verifying, and are used to operate internal data when storing the 2-level data ("0" or "1"), for example, of the memory cell transistor MT. The TDC amplifies the data of the bit line BL when reading the data and temporarily holds the same, and is used to operate the internal data when storing the 2-level data, for example.

The SDC includes clocked inverter circuits 60 and 61, which constitute a latch circuit, and n-channel MOS transistors 62 and 63. One end of a current pathway of the MOS transistor 62 is connected to an output end of the clocked inverter circuit 60 at a node N2a. Also, the other end of the current pathway of the MOS transistor 62 is connected to an output end of the clocked inverter circuit 61 at a node N2b. Also, a signal EQ2 is supplied to a gate of the MOS transistor 62. One end of a current pathway of the MOS transistor 63 is connected to the output end of the clocked inverter circuit 61 at the node N2b and the other end of the current pathway is grounded. Also, a signal PRST is supplied to a gate of the transistor 63. One end of a current pathway of a column selection MOS transistor 64 is connected to the node N2a and the other end thereof is connected to the input/output data line $D_{line}$. Also, one end of a current pathway of a column selection transistor 65 is connected to the node N2b and the other end thereof is connected to the input/output data line $D_{line}$. A column selection signal CSLi is supplied to gates of the MOS transistors 64 and 65. That is, the data is input and output to and from the input/output data line $D_{line}$ by turning on the MOS transistors 64 and 65 by the signal CSLi. Also, one end of a current pathway of a MOS transistor 66 is connected to the node N2a and the other end thereof is connected to a node N12. One end of a current pathway of a MOS transistor 67 is connected to the node N12 and the other end thereof is connected to a node N1a of the PDC. Also, a signal BLC2 is supplied to a gate of the MOS transistor 66 and a signal BLC1 is supplied to a gate of the MOS transistor 67.

The PDC includes clocked inverter circuits 68 and 69 and an n-channel MOS transistor 70. One end of a current pathway of the MOS transistor 70 is connected to an output end of the clocked inverter circuit 68 at a node N1b and the other end thereof is connected to an output end of the clocked inverter circuit 69 at the node N1a. Also, a signal EQ1 is supplied to a gate of the MOS transistor 70. Also, the node N1b of the PDC is connected to a gate of a MOS transistor 71. One end of a current pathway of the MOS transistor 71 is connected to one end of a current pathway of a MOS transistor 72 and the other end thereof is connected to one ends of current pathways of MOS transistors 73 and 74, which constitute a transfer gate. Also, the other end of the current pathway of the MOS transistor 72 is grounded. A signal CHK1 is supplied to a gate of the MOS transistor 72. A signal CHK2 is supplied to a gate of the MOS transistor 73. Also, a signal COMi is supplied to the other ends of the current pathways of the MOS transistors 73 and 74. The signal COMi is the signal common to the sense amplifier 5, which indicates whether verification is completed in the sense amplifier 5. That is, when the verification is completed, the node N1b of the PDC is set to the "L" level. In this state, when the signals CHK1 and CHK2 are set to the "H" level, when the verification is completed, the signal COMi is set to the "H" level. Also, a gate of the MOS transistor 74 is connected to the other end of the current pathway of the MOS transistor 66 and one end of the current pathway of the MOS transistor 67.

Further, the TDC includes a MOS capacitor 75, for example. One electrode of the capacitor 75 is connected to the node N12 and the other electrode is grounded. Also, one end of the current pathway of the MOS transistor 76 is connected to the connection node N12. The DDC is connected to the other end of the current pathway of the MOS transistor 76. A signal REG is supplied to a gate of the MOS transistor 76.

The DDC includes n-channel MOS transistors 77 and 78. A signal VREG is supplied to one end of a current pathway of the MOS transistor 77 and the other end thereof is connected to the other end of the current pathway of the MOS transistor 76. A gate of the MOS transistor 77 is connected to one end of a current pathway of the MOS transistor 78 and is connected to the node N1a of the above-described PDC through the other end of the current pathway of the MOS transistor 78. A signal DTG is supplied to a gate of the MOS transistor 78.

Further, one ends of current pathways of MOS transistors 79 and 80 are connected to the node N12. One end of a current pathway of a MOS transistor 86 is connected to the other end of the current pathway of the MOS transistor 80. The voltage VDD is supplied to the other end of the current pathway of the MOS transistor 86. That is, when reading and writing the data, the voltage VDD is supplied to the bit line BL through the MOS transistor 80 and the node N12.

A signal BLCLAMP is supplied to a gate of the MOS transistor 79 and the other end of the current pathway is connected to one end of a current pathway of a MOS transistor 6a. Also, the other end of the MOS transistor 6a is connected in common to one end of a current pathway of a MOS transistor 6b and to a bit line BL(i+1) and a signal BLS(i+1) is given to a gate thereof. One end of a current pathway of a p-channel MOS transistor 85 (which serves as a non-selected circuit) is connected to the other end of the current pathway of the MOS transistor 6b. Then, the voltage VDD is supplied to the other end of the current pathway of the MOS transistor 85.

That is, the voltage VDD is supplied to the other end of the current pathway of the MOS transistor 6b through the MOS transistor 85 and a signal BIAS(i+1) is given to the gate thereof.

One end of a current pathway of a MOS transistor 6c is connected to the other end of the current pathway of the MOS transistor 79 and the other end of the current pathway is connected to one end of a current pathway of a MOS transistor 6d and to a bit line BLi, and a signal BLSi is given to the gate thereof. A signal BIASi is given to a gate of the MOS transistor 6d and the other end of the current pathway thereof is connected in common to the other end of the current pathway of the MOS transistor 6b. That is, the voltage VDD is supplied to the other end of the current pathway of the MOS transistor 6d.

The MOS transistors 6b and 6d are turned on in a complementary manner with the MOS transistors 6a and 6c, respectively, according to the signal BIAS(i+1) and the signal BIASi to supply the voltage VDD to the non-selected bit line BL. Meanwhile, hereinafter, an even-numbered bit line BL is represented as a bit line BLi (i is an even number: i=0, 2, 4, . . . , n) and an odd-numbered bit line BL is represented as a bit line BL(i+1). The above-described MOS transistors 6a to 6d serve as the MOS transistors 6 in FIG. 1. That is, the signal BLSi, the signal BLS(i+1), the signal BIASi, and the signal BIAS(i+1) are transferred from the BLC driver to each of the MOS transistors 6a to 6d as a signal BLC.

When the MOS transistors 6a to 6d are turned on, a voltage (VDD+Vth1) corresponding to the "H" level is transferred from the BLC driver 7 as the signal BLSi, the signal BLS(i+1), the signal BIASi, and the signal BIAS(i+1). Also, when the MOS transistors 6a to 6d are turned off, a voltage corresponding to the "L" level, for example, zero potential is transferred as the signal BLSi, the signal BLS(i+1), the signal BIASi, and the signal BIAS(i+1).

In this manner, each of the n-channel MOS transistors 6a to 6d connects the bit line BL to the sense amplifier 5. That is, each of the MOS transistors 6a to 6d is such that one end of the current pathway thereof is connected to a corresponding bit line BL and the other end of the current pathway thereof is connected to the sense amplifier 5. Meanwhile, a threshold of the MOS transistor 6 is set to Vth1 and gate capacitance C is formed between each of the gate electrodes of the MOS transistors 6a to 6d and a silicon substrate.

<Regarding BLC Driver 7>

Next, the BLC driver 7 will be described with reference to FIG. 5. FIG. 5 is a block diagram of the BLC driver 7. The BLC driver 7 according to this embodiment is the driver capable of transferring the currents having the different current supply capacities to the gate of the MOS transistor 6 as the signal BLC, as described above. In this embodiment, the BLC driver 7 includes charging circuits 90 and 100 having different current supply capacities. Although circuits, which constitute the charging circuits 90 and 100, are not particularly limited as long as the current supply capacities are different between the charging circuits 90 and 100, the following configuration is herein described as an example.

The charging circuit 90 will be first described. The charging circuit 90 includes an n-channel MOS transistor 91 and a resistance element 92. The voltage (VDD+Vth1) is supplied to one end of a current pathway of the MOS transistor 91 and the other end of the current pathway is connected to one end of the resistance element 92. Since the threshold voltage of the MOS transistor 6 is Vth1, the sense amplifier 5 may charge the bit line BL with the voltage VDD. Meanwhile, a threshold voltage of the MOS transistor 91 is set to Vth2. That is, at least a voltage (VDD+Vth1+Vth2) is applied to a gate of the MOS transistor 91.

Next, the resistance element 92 will be described. A resistance value of the resistance element 92 is set to R1. The other end of the resistance element 92 is connected to the gate of the MOS transistor 6 through the node N2. A current $I_1$ corresponding to the resistance element 92 is transferred to the node N2.

Next, the charging circuit 100 will be described. The charging circuit 100 includes an n-channel MOS transistor 101 and a resistance element 102. The voltage (VDD+Vth1) is supplied to one end of a current pathway of the MOS transistor 101 and the other end of the current pathway is connected to one end of the resistance element 102. According to this, the sense amplifier 5 may charge the bit line BL with the voltage VDD. Meanwhile, a threshold voltage of the MOS transistor 101 is set to Vth3. That is, at least a voltage (VDD+Vth1+Vth3) is applied to a gate of the MOS transistor 101.

Next, the resistance element 102 will be described. A resistance value of the resistance element 102 is set to R2 (<R1). The other end of the resistance element 102 is connected to the gate of the MOS transistor 6 through the node N2. A current $I_2$ (>current $I_1$) corresponding to the resistance element 102 is transferred to the node N2. As described above, due to the current $I_2$ (>current $I_1$), the charging circuit 100 has the current supply capacity higher than that of the charging circuit 90.

Although it is possible to make the resistance values of the resistance elements 92 and 102 different from each other to change the current supply capacities in this manner, it is also possible to change device properties of the MOS transistors 91 and 101 to change the current supply capacities of the charging circuits 90 and 100 in addition to this. That is, the current supply capacity of the charging circuit 100 may be improved more than that of the above-described charging circuit 90 by using a technique to improve the supply capacity of the current, which passes through a channel of the MOS transistor 101, to more than that of the MOS transistor 91 by making a ratio of a gate width/a gate length of the MOS transistor 101 larger than that of the MOS transistor 91 (specifically, refer to the description of FIG. 6).

Further, the above-described charging circuits 90 and 100 may have configurations without the resistance elements 92 and 102, respectively. This state is illustrated in FIG. 6. FIG. 6 is a block diagram of the BLC driver 7. As illustrated, the charging circuits 90 and 100 are formed of the MOS transistors 91 and 101, respectively.

At this time, when the gate width and the gate length of the MOS transistor 91 are set to w1 and l1, respectively, the ratio of the gate width and the gate length is w1/l1.

When the gate width and the gate length of the MOS transistor 101 are set to w2 and l2, respectively, the ratio of the gate width and the gate length is w2/l2. Suppose that a relationship of w2/l2>w1/l1 is satisfied at this time. According to this, it is possible to improve the current supply capacity of the charging circuit 100 to more than that of the charging circuit 90 also in the configuration provided with the MOS transistors 91 and 101.

Meanwhile, when the charging circuit 90 is selected, for example, by the controller 9, the MOS transistor 91 is turned on by the controller 9. Therefore, the charging circuit 90 may output the current $I_1$ to the node N2. Similarly, when the charging circuit 100 is selected, for example, by the controller 9, the MOS transistor 101 is turned on by the controller 9. Therefore, the charging circuit 100 may output the current $I_2$ to the node N2.

<Regarding Data Input/Output Circuit 8>

The data input/output circuit 8 will be described with reference to FIG. 1 again. The data input/output circuit 8 outputs an address and a command supplied from a host through an I/O terminal, not illustrated, to the controller 9. Also, the data input/output circuit 8 outputs the write data to the sense amplifier 5 through the data line $D_{line}$. Also, when outputting the data to the host, the data input/output circuit 8 receives an instruction from the controller 9 to receive the data amplified by the sense amplifier 5 through the data line $D_{line}$, and thereafter outputs the same to the host through the I/O terminal.

<Regarding Controller 9>

The controller 9 will be described. The controller 9 controls operation of an entire NAND flash memory. That is, the controller 9 executes an operation sequence in the write operation, the read operation, and the erase operation of the data based on the above-described address and command given from the host not illustrated through the data input/output circuit 8. The controller 9 generates a block selection signal/column selection signal based on the above-described address and operation sequence.

The controller 9 outputs the block selection signal to the row decoder 2. The block selection signal is the signal with which the row decoder 2 selects any one of a plurality of memory blocks BLK0 to BLKs when reading, writing and erasing the data.

Also, the controller 9 outputs the column selection signal to the sense amplifier 5. The column selection signal is the signal to select a column direction of the sense amplifier 5.

Also, a control signal supplied from a memory controller, not illustrated, is given to the controller 9. By the supplied control signal, it is distinguished whether the signal supplied from the host to the data input/output circuit 8 through the I/O terminal, not illustrated, is the address or the data.

Also, the controller 9 controls a timing to switch the current supply capacity (the current $I_1$ or the current $I_2$) of the above-described BLC driver 7. The timing is determined by the current supply capacity of the charging circuit 100, the resistance value of the resistance element 102 of the charging circuit 100, and the capacitance C of the MOS transistor 6. By controlling this timing, a peak current, which flows to the bit line BL, is inhibited, for example. A specific timing is the timing such that there are peaks (mountain-shaped waveforms) of the same height in the bit line BL before and after switching the output of the charging circuit 90 and the charging circuit 100.

Meanwhile, the current supply capacity of the BLC driver 7 is switched by turning on the MOS transistors 91 and 101 of the charging circuits 90 and 100, respectively, as described above.

<Regarding MOS Transistor 10>

Next, the MOS transistor 10 will be described. One end of a current pathway of the MOS transistor 10 is connected to the source line SL, the other end thereof is grounded, and a signal Clamp_S is given to a gate thereof. That is, the MOS transistor 10 serves as a source line SL driver. When the MOS transistor 10 is turned on, the potential of the source line SL is set to 0 [V]. Meanwhile, the signal Clamp_S given to the gate of the MOS transistor 10 is controlled by the controller 9.

<Regarding Example of Write Operation of "1" Data (1)>

Figure 7:
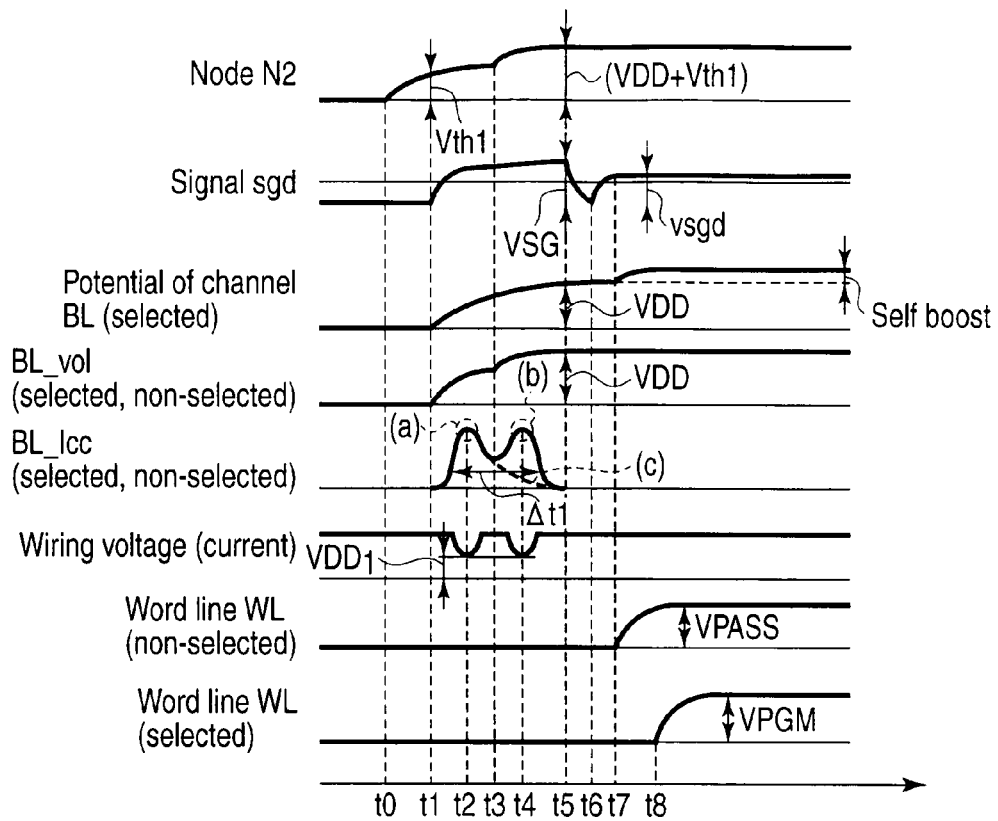
FIG. 7 is a time chart illustrating a write operation of the NAND flash memory according to the first embodiment.

Next, an example of the write operation in the above-described configuration will be described with reference to FIG. 7. FIG. 7 is a time chart of the potential of the node N2 (the gate of the MOS transistor 6), signal sgd, potential of a channel of the selected bit line BL, potential BL_vol and a current Icc of the selected and non-selected bit lines, potential of the wiring in the sense amplifier 5, and potentials of the selected and non-selected word lines WL. The timing of switch operation of the currents $I_1$ and $I_2$ supplied to the node N2 is controlled by the controller 9. Meanwhile, the operation of the non-selected bit line BL is identical to the writing of the "1" data in the selected bit line BL, so that the description thereof is omitted. Also, the selected word line WL of the memory cell transistor MT, which is the write target, is set to a word line WL32, for example. Therefore, the voltage VPASS is transferred to the non-selected word lines WL0 to 31 and WL33 to WL63, and the voltage VPGM is transferred to the selected word line WL32.

First, at a time t0, the charging circuit 90 transfers the current $I_1$ to the node N2. Then, at a time t1, the potential of the node N2 becomes Vth1. That is, the MOS transistor 6 is turned on. Therefore, the sense amplifier 5 and the bit line BL are electrically connected to each other. Therefore, the potential of the selected bit line BL and the non-selected bit line BL increases from the time t1 by the sense amplifier 5.

Also, at the same time t1, the signal sgd of the "H" level is supplied to the gate of the selection transistor ST1. That is, since the signal sgd increases up to the voltage VDD, for example, the selection transistor ST1 is turned on. Therefore, the potential of the channel increases.

When the potential of the selected and non-selected bit lines BL increases, the current Icc corresponding to the increased voltage flows to the bit lines BL. That is, after the time t1, with the increase in the potential of the node N1, the current Icc corresponding to the increase in the voltage of the bit line BL starts to flow and the current Icc reaches the peak at a time t2. Since the current, which flows to the bit line BL, reaches a peak value at the time t2, the potential of the wiring in the sense amplifier 5 for transferring the current to the bit line BL decreases. The potential of the wiring in the sense amplifier 5 at that time is set to a voltage VDD1 (<voltage VDD).

Thereafter, with the increase in the potential of the bit line BL, a current value, which flows to the bit line BL, decreases. That is, the potential of the wiring in the sense amplifier 5 starts to increase to its original voltage VDD.

Then, at a time t3, the controller 9 switches from the charging circuit 90 to the charging circuit 100. As described above, the current supply capacity of the charging circuit 100 is larger than that of the charging circuit 90. That is, at the time t3, the gradient of the increasing potential of the node N2 and the bit line BL becomes sharper. That is, the current Icc corresponding to the difference between the potential of the bit line BL at the time t3 and the voltage VDD flows to the bit line BL after the time t3.

The current, which flows to the bit line BL, has the mountain-shaped waveform having the peak again at a time t4. Due to the peak, the potential of the wiring in the sense amplifier 5 for transferring the current to the bit line BL decreases again to the voltage VDD1. Meanwhile, the peak values at the times t2 and t4 are substantially identical to each other.

Thereafter, at a time t5, the potential applied to the node N2 is set to the voltage (VDD+Vth1). With this, the potential of the selected and non-selected bit lines BL and that of the channel of the selected bit line BL reach the voltage VDD (saturated). That is, the current, which flows to the bit line BL, is substantially 0 at the time t5.

At a time t6, the signal sgd decreases to the zero potential. Due to this, the selection transistor ST1 is put into a cut-off state. Further, at a time t7, the voltage VPASS is transferred to the non-selected word lines WL0 to 31 and WL 33 to 63. Therefore, the potential of the bit line BL increases from the voltage VDD (this is referred to as self boost). Then, at a time t8, the voltage VPGM is transferred to the selected word line WL32. At this time, since the potential of the channel increases by the above-described self boost, a negative charge enough for a threshold shift is not injected to the charge storage layer. That is, the "1" data is written.

Although the writing of the "1" data has been described above as an example, since the operation from the time t0 to t5 is identical to the read operation and the verify operation of the data, the description thereof is omitted.

That is, in the read operation of the data also, when switching the charging circuits 90 and 100, a mountain-shaped current as illustrated in FIG. 7 is generated in the bit line BL. Meanwhile, at this time, the third and fourth voltage generators transfer the voltages VREAD and VCGR to the word lines WL.

Effect According to this Embodiment

The nonvolatile semiconductor device according to this embodiment may obtain effects (1) and (2).

(1) It is possible to inhibit the power consumption and prevent the delay of the charge of the bit line BL while inhibiting the peak current.

In order to easily understand the description of the effects obtained by the nonvolatile semiconductor storage device of this embodiment, a comparative example will be herein described. Hereinafter, in a nonvolatile semiconductor storage device in the comparative example, the same reference numerals are assigned to the same configuration as that of this embodiment and the overlapped description is omitted.

The nonvolatile semiconductor storage device in the comparative example has a configuration obtained by removing a charging circuit 100 from a BLC driver 7. That is, a MOS transistor 6 is driven only by a charging circuit 90. A voltage higher than that of this embodiment, that is to say, a value not smaller than a voltage (VDD+Vth1) is supplied to one end of a current pathway of a MOS transistor 91, which constitutes the charging circuit 90. This is the configuration for allowing the potential of a bit line BL to reach a voltage VDD by increasing the current supply capacity of the charging circuit 90 to make the potential of a node N2 of the MOS transistor 6 not lower than the voltage (VDD+Vth1). However, when it is intended to increase a current amount per unit time supplied to the node N2, a peak value of the current, which flows to the bit line BL, becomes high. Therefore, the current amount supplied per unit time to the node N2 is adjusted in order to inhibit the peak value. Herein, the charging circuit 90 in the comparative example is configured to output a current $I_1$. That is, the charging circuit 90 in the comparative example is provided with the current supply capacity identical to that of the charging circuit 90 according to this embodiment.

However, in the configuration of the comparative example, since the voltage not smaller than the voltage (VDD+Vth1) is increased, a circuit area of a pump circuit increases, and in addition to this, power consumption becomes large. Further, due to a resistance value R1 of a resistance element 92 and a gate capacitance C of the MOS transistor 6, as the potential of the bit line BL approaches the voltage VDD, the current, which flows to the bit line BL, decreases, and it takes time until the potential of the bit line BL reaches the voltage VDD. That is, there is a problem of delay.

On the other hand, the nonvolatile semiconductor storage device according to this embodiment may overcome the above-described problem. The nonvolatile semiconductor storage device according to this embodiment includes the charging circuits 90 and 100 having different current supply capacities. In this embodiment, the voltage (VDD+Vth1) is supplied to one end of the current pathway of the MOS transistor 91 and the current $I_1$ is output from the other end thereof. That is, this is provided with the configuration with the same current supply capacity while inhibiting the power consumption more than the charging circuit 90 in the comparative example. In this manner, the current amount, which flows to the node N2, may be maintained with the voltage (VDD+Vth1) lower than that of the comparative example because the resistance value of the resistance element 92 is decreased and the current supply capacity is increased. Also, since there is no difference in the current supply capacity between the same and the charging circuit 90 in the comparative example, the peak value of the current, which flows to the bit line BL, may be inhibited as in the comparative example by the charging circuit 90 according to this embodiment.

As described above, the charging circuit 100 is provided with the current supply capacity larger than that of the charging circuit 90. However, the value of the voltage supplied to one end of the current pathway of the MOS transistor 101 is the voltage (VDD+Vth1) also in the charging circuit 100, that is to say, the voltage identical to that of the charging circuit 90 is supplied. That is, even when the value of the voltage supplied to one end of the current pathway of the MOS transistor 101 is the voltage (VDD+Vth1), by providing the resistance value R2 of the resistance element 102 much smaller than R1, the current supply capacity larger than that of the charging circuit 90 may be obtained. That is, it is possible to improve the current supply capacity while inhibiting the power consumption more than in the configuration according to the comparative example.

In this embodiment, at the time t3 after the peak value (FIG. 7, refer to a point A) of the current, which flows to the bit line BL, the controller 9 switches the output from the charging circuit 90 to the charging circuit 100. That is, since the potential of the bit line BL increases after the time t3, for example, the current Icc of the bit line BL originally decreases (FIG. 7, refer to C); however, this embodiment is provided with a configuration to switch to a much higher current supply capacity at the time t3. Therefore, it becomes possible to allow the peak current to flow to the bit line BL and rapid bit line BL charge becomes possible (FIG. 7, refer to the current, which flows to the bit line BL, and the potential). Meanwhile, since a product of the voltage charged to the bit line BL and the capacitance provided in the bit line BL is the current amount, which flows to the bit line BL (FIG. 7, area from the time t1 to t5), it is possible to make Δt1 shorter by allowing the peak current to flow at the times t2 and t4 as illustrated in FIG. 7. That is, it becomes possible to allow the voltage of the bit line BL to rapidly reach the voltage VDD.

(2) Operation Reliability May be Maintained.

The nonvolatile semiconductor storage device according to this embodiment may inhibit the peak current Icc, which flows to the bit line BL, as described above. That is, although the potential in the sense amplifier 5, which supplies the current to the bit line BL, or the signal line $D_{line}$ connected to the sense amplifier 5 decreases to the voltage VDD1 (FIG. 7, refer to the times 2 and t4), the voltage VDD1 is the voltage in a range in which the NAND flash memory may operate. That is, the nonvolatile semiconductor storage device according to this embodiment may maintain the same stable operation reliability as before while obtaining the above-described effect (1).

Second Embodiment

Next, a nonvolatile semiconductor device according to a second embodiment will be described. In the nonvolatile semiconductor device according to this embodiment, charging circuits 90 and 100 are removed from a BLC driver 7 of the first embodiment and the BLC driver 7 constitutes a current mirror with a MOS transistor 6. That is, a configuration is such that a MOS transistor having the same property as the MOS transistor 6 is provided in the BLC driver 7 and a dummy bit line BL_dummy (hereinafter, represented as a dummy bit line BLd) having the same wiring capacitance as a bit line BL is connected to a source end of the MOS transistor. This is because the MOS transistor provided in the BLC driver 7 and the MOS transistor 6, and the dummy bit line BLd and the bit line BL are formed in the same processes, respectively. A configuration of the nonvolatile semiconductor storage device according to this embodiment will be hereinafter described. Meanwhile, the same reference numerals are assigned to the same configuration as that of the above-described first embodiment, and the description is omitted for an overlapped configuration.

Configuration Example

Figure 8:
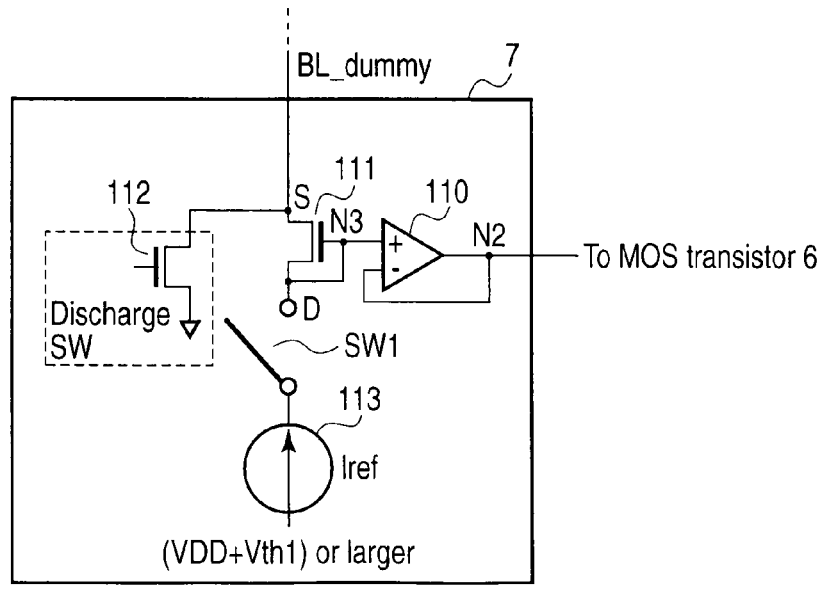
FIG. 8 is a block diagram of a BLC driver according to a second embodiment.

A configuration of the BLC driver 7 of the nonvolatile semiconductor storage device according to this embodiment will be described with reference to FIG. 8. As illustrated in FIG. 8, the BLC driver 7 according to this embodiment includes an operation amplifier 110, n-channel MOS transistors 111 and 112, and a current source 113.

As illustrated in FIG. 8, a current Iref is supplied by the current source 113 to one end of a current pathway of the MOS transistor 111 through a switch sw1. The current source 113 generates the current Iref from a voltage larger than a voltage (VDD+Vth1). The other end of the current pathway of the MOS transistor 111 is connected to one end of the dummy bit line BLd and one end of a current pathway of the MOS transistor 112. One end (drain end) and a gate of the current pathway of the MOS transistor 111 are connected in common, that is to say, diode connected. That is, the potential difference between one end (drain) and the other end (source) of the current pathway of the MOS transistor 111 and potential difference between the other end (source) and the gate of the current pathway are identical to each other. Therefore, the MOS transistor 111 performs a pentode operation.

When a gate voltage of the MOS transistor 111 increases by the current source 113, the current Iref corresponding to the voltage at the gate flows to a channel of the MOS transistor 111. The current Iref flows to the source end through the channel of the MOS transistor 111 and the potential of the dummy bit line BLd increases. With this, even when the potential of the dummy bit line BLd increases, the gate potential of the MOS transistor 111 also increases by the increase in the voltage of the dummy bit line BLd, so that a stable current Iref continuously flows to a channel region of the MOS transistor 111. This is because the MOS transistor 111 includes a diode-connected configuration.

Also, the voltage of the gate of the MOS transistor 111 (node N2) is input to a positive input terminal of the operation amplifier 110. The operation amplifier 110 is a unity gain buffer of which output end is fed back to an inverted input terminal. That is, the operation amplifier 110 operates such that voltage difference input to the positive input terminal and the inverted input terminal thereof is identical. In other words, the operation amplifier 110 operates such that a voltage at the positive input terminal and potential at the output end are identical to each other. Meanwhile, in this embodiment, a condition is such that a minimum value of an input voltage range of the operation amplifier 110 is set to not larger than 0

V and a maximum value of an output voltage range is set to be larger than the voltage (VDD+Vth1).

In general, an n-channel MOS transistor is used as the positive input terminal of the operation amplifier (that is to say, a gate of the n-channel MOS transistor is the positive input terminal). If the MOS transistor has a certain threshold voltage (herein, Vth4), for example, the operation amplifier operates (outputs to the node N2) only after the potential of a node N3 becomes a voltage Vth4. That is, a phenomenon occurs in which the current does not flow to a channel of the MOS transistor 6 even though a certain current flows to the channel of the MOS transistor 111 before the potential of the node N3 reaches the threshold voltage Vth4. That is, the current mirror is not formed. In order to prevent such phenomenon, in this embodiment, the minimum value of the positive input terminal of the operation amplifier 110 is not larger than 0 V, that is to say, a depression (D-type) n-channel MOS transistor is used.

Therefore, the potential of the gate of the MOS transistor 111 and gate potential of the MOS transistor 6 are identical to each other. Since the operation amplifier 110 forcedly makes the potential of the node N2 identical to that of the node N3, it is possible to make the potential of the gate of the MOS transistor 111 and the potential of the gate of the MOS transistor 6 identical to each other without depending on a value of a gate capacitance C of the MOS transistor 6. That is, the current mirror circuit may be formed of the MOS transistor 111 and the MOS transistor 6. From the above, the current Iref similar to the current, which flows to the channel of the MOS transistor 6, flows to the channel of the MOS transistor 111. Meanwhile, when the number of the bit lines BL is n, for example, the current of Iref×n flows to an entire NAND flash memory.

<Regarding Example of Write Operation of "1" Data (2)>

Figure 9:
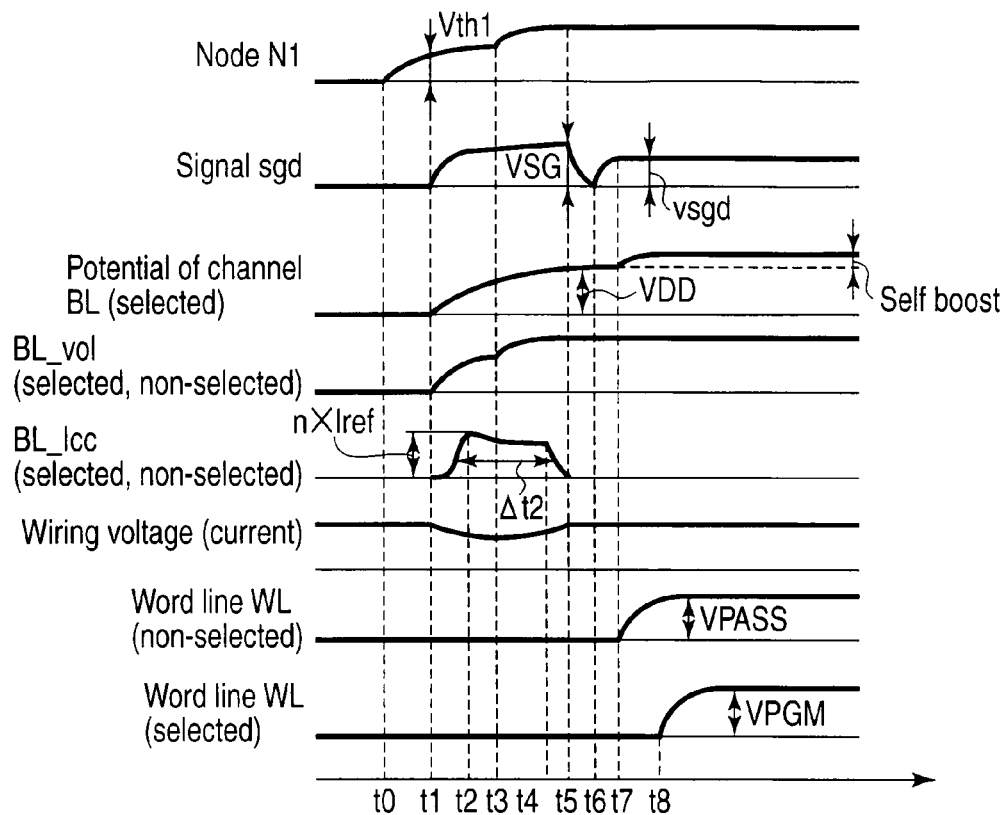
FIG. 9 is a time chart illustrating a write operation of the NAND flash memory according to the second embodiment.

Next, an example of the write operation in the above-described configuration will be described with reference to FIG. 9. FIG. 9 is a time chart of the potential of the node N2 (gate of the MOS transistor 6), a signal sgd, potential of a channel of a selected bit line BL, potential BL_vol and a current Icc (indicated as BL_Icc in the drawing) of selected and non-selected bit lines, potential of wiring in a sense amplifier 5, and potentials of selected and non-selected word lines WL. Meanwhile, the operation of the non-selected bit line BL is identical to that of writing of "1" data in the selected bit line BL, so that the description thereof is omitted. The description of a point identical to that of the write operation according to the above-described first embodiment is omitted. In this embodiment, the selected word line WL of the memory cell transistor MT, which is a write target, is set to a word line WL32, for example. Therefore, a voltage VPASS is transferred to non-selected word lines WL0 to 31 and WL33 to WL63, and a voltage VPGM is transferred to the selected word line WL32.

At a time t1, the potential of the node N2 is set to a voltage Vth1 by the BLC driver 7. According to this, the MOS transistor 6 is turned on and the current flows to the bit line BL, so that the potential of the bit line BL increases. Since the current mirror includes the MOS transistor 111 and the MOS transistor 6, the current Icc, which flows to the bit line BL, is made the current Iref similar to that of the MOS transistor 111. Although the potential between the gate and the source (Vgs) of the MOS transistor 6 increases with the increase in the potential of the bit line BL, since the gate potential of the MOS transistor 111 increases by the increase in the dummy bit line BLd as described above, a substantially constant current Iref flows to the channel of the MOS transistor 111. That is, a stable current Iref continuously flows to the channel of the MOS transistor 6 also (the current Icc in FIG. 9 is that of a case in which there are n bit lines BL. That is, a current of Iref×n flows in the entire NAND flash memory). That is, from time t2 to t4, the substantially constant current Iref flows to each bit line BL. Herein, a time period from rising to trailing of the current, which flows to the bit line BL, is set to Δt2. Herein, a relationship of Δt1>Δt2 is satisfied. This is because the current Iref, which flows to the bit line BL, is substantially constant from the time t2 to t4 and it is possible to charge the bit line BL to a voltage VDD in a shorter time than in the above-described first embodiment.

Also, when the "1" data is written to the memory cell transistor MT after a time t8, a selection transistor ST2 is turned on by a signal sgs in order to discharge the potential of the bit line BL. Also, at this time, the dummy bit line BLd is also charged with the voltage VDD. Therefore, in order to discharge the bit line BL after the time t8, the MOS transistor 112 is turned on.

Effect According to this Embodiment

The nonvolatile semiconductor storage device according to this embodiment may obtain the following effect (3) in addition to the above-described effect (2).

(3) It is possible to prevent further delay of the bit line BL charging time while inhibiting a peak current, which flows to the bit line BL.

In the nonvolatile semiconductor storage device according to this embodiment, the BLC driver 7 includes the MOS transistor 111, which constitutes the current mirror with the MOS transistor 6. Further, the BLC driver 7 includes the operation amplifier 110, which operates such that the potential of the gate of the MOS transistor 111 and the potential of the gate of the MOS transistor 6 are identical to each other. Therefore, when the gate capacitance of the MOS transistor 6 is large also, the current supplied to the gate of the MOS transistor 6 may be made a constant value and a substantially constant current Icc (Iref) flows to each bit line BL. That is, the current, which flows to the bit line BL, has a trapezoidal shape (refer to FIG. 8), the potential of the bit line BL rapidly increases to the voltage VDD. In other words, Δt2<Δt1 is satisfied, and the time period of the current Iref, which flows to the bit line BL, may be made short. From the above, it is possible to prevent delay of bit line BL charging time while inhibiting a peak value of the current, which flows to the bit line BL.

Meanwhile, when the gate capacitance of the MOS transistor 6 is small, the operation amplifier 110 may be removed. This case will be hereinafter described in a modified example.

Modified Example

Next, a nonvolatile semiconductor storage device according to a modified example of the above-described second embodiment will be described. The nonvolatile semiconductor storage device according to the modified example controls a MOS transistor 6 by a plurality of BLC drivers 7. That is, one BLC driver 7 is provided for four MOS transistors 6, for example. That is, in a NAND flash memory, when 16 bit lines BL are provided, for example, four BLC drivers 7 are provided. In this case, gate capacitance C connected in parallel for one BLC driver 7 is smaller than that of the above-described first and second embodiments. Therefore, as described above, when the gate capacitance C is small, a configuration obtained by removing the operation amplifier 110 from the above-described second embodiment is possible. In other words, when the gate capacitance C of the MOS transistor 6 is small, it is not required that the operation amplifier 110 forcedly makes the voltages applied to a gate of the MOS transistor 6 and to a gate of a MOS transistor 112 identical to each other. A configuration example of the nonvolatile semiconductor storage device according to the modified example will be hereinafter described. Meanwhile, the same reference numerals are assigned to the same configuration and the description is omitted for the overlapped configuration.

Configuration Example

Figure 10:
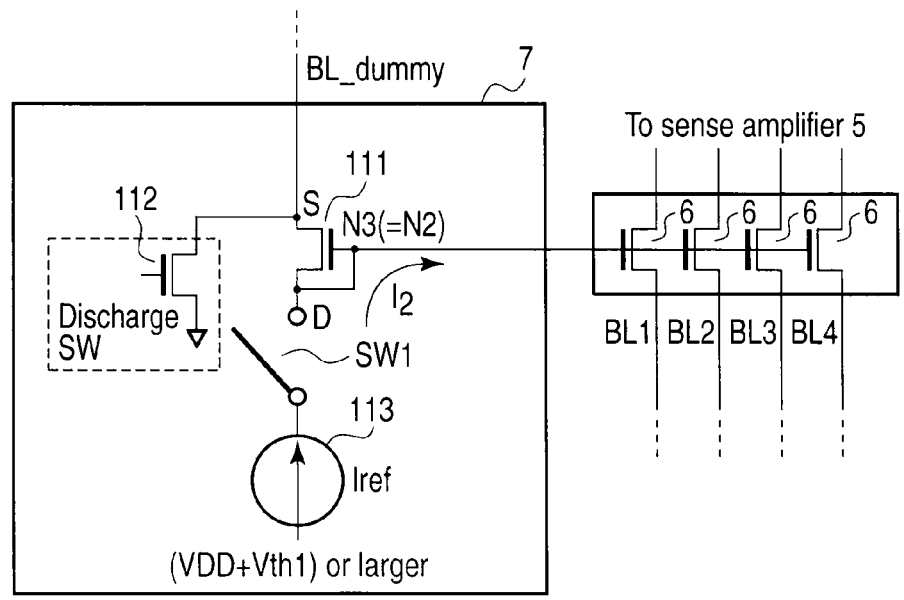
FIG. 10 is a block diagram of a BLC driver according a modified example of the second embodiment.

FIG. 10 is an example of a case in which four MOS transistors 6 are provided for one BLC driver 7. That is, when n bit lines BL are provided, n/4 BLC drivers 7 are provided. In this case, as illustrated in FIG. 10, a configuration without the operation amplifier 110 in the BLC driver 7 also is possible.

A current Iref supplied from a current source 113 is transferred to one end and a gate of a current pathway of a MOS transistor 111. That is, the current Iref output from the current source 113 is branched to flow to a channel and the gate of the MOS transistor 6 (indicated by arrows I1 and I2 in the drawing). As described above, when the gate capacitance of the MOS transistor 6 is negligibly smaller than the gate capacitance of the MOS transistor 111, a case in which potential of the gate of the MOS transistor 6 hardly increases does not occur. That is, as in the above-described second embodiment, the potential of a node N3 (node N2) increases and with this, the current Iref flows to a channel of the MOS transistor 111. The MOS transistor 111 and the MOS transistor 6 form a current mirror. Therefore, the current Iref similar to that in the MOS transistor 111 flows also to each MOS transistor 6. For example, in a case of the NAND flash memory provided with n bit lines BL, a current of Iref×n flows to an entire NAND flash memory.

In the modified example also, the MOS transistor 111 is diode connected, so that a stable current Iref may be allowed to flow to the bit line BL even when the potential of the bit line BL increases.

Meanwhile, since the write operation of "1" data in the modified example is similar to the operation described in the above-described second embodiment, the description thereof is omitted.

Effect According to Modified Example

The nonvolatile semiconductor storage device according to the modified example may also obtain the above-described effects (2) and (3).

That is, in the BLC driver 7 described in the above-described second embodiment, when a plurality of BLC drivers 7 are provided, the configuration without the operation amplifier 110 is possible. In this case also, the current supplied to the gate of the MOS transistor 6 may be made a constant value and a substantially constant current Iref flows to the bit line BL. That is, since the current, which flows to the bit line BL, has a trapezoidal shape (refer to FIG. 9), the potential of the bit line BL rapidly increases to a voltage VDD. In other words, Δt2<Δt1 is satisfied and a time period of the current Iref, which flows to the bit line BL, also may be short. From the above, it is possible to prevent a delay of the bit line BL charging time while inhibiting a peak value of the current, which flows to the bit line BL.

Further, the above-described embodiment includes the following nonvolatile semiconductor storage device.

1. A nonvolatile semiconductor storage device, comprising:
a memory string in which current pathways of a plurality of memory cells each including a charge storage layer and a control gate and capable of holding 2-or-more-level data are connected in series;
a bit line connected to one end of the current pathway of the memory cell on a side closest to a drain of the memory cells that constitute the memory string;
a sense amplifier that reads and writes the data from and to the memory cells according to a voltage applied to the bit line;
a first n-channel MOS transistor to one end of a current pathway of which the sense amplifier is connected and to the other end of the current pathway of which the bit line is connected; and
a driver circuit that controls on/off of the first n-channel MOS transistor, wherein
the driver circuit includes:
a second n-channel MOS transistor that forms a mirror circuit with the first n-channel MOS transistor, and is diode-connected with one end and a gate of a current pathway thereof,
a dummy bit line connected to the other end of the current pathway of the second n-channel MOS transistor, and
a current source connected to one end of the current pathway of the second n-channel MOS transistor.

2. The above-described 1, further comprising a comparator that compares a first voltage applied to a gate of the first n-channel MOS transistor with a second voltage applied to the gate of the second re-channel MOS transistor such that currents, which flow to the first and second n-channel MOS transistors, are identical to each other.

3. The above-described 1, wherein the bit line is charged up to a first voltage by the sense amplifier when reading and writing the data, and
the current source generates the current by a voltage source larger than the first voltage.

Meanwhile, although it has been described that the controller 9 switches the current output by the charging circuits 90 and 100 at the node N2 (gate of the MOS transistor 6) from the current $I_1$ to the current $I_2$ at the time t2 in the nonvolatile semiconductor storage device according to the above-described first embodiment, the current output to the node N2 may also be the current ($I_1+I_2$). At this time, the resistance elements R1 and R2 provided on the charging circuits 90 and 100, respectively, are connected in parallel and an entire resistance value decreases. In other words, the value becomes lower than each of the resistance values R1 and R2 and the current value, which flows to the node N1, increases.

Meanwhile, the peak values of the current Icc, which flows to the bit line BL, in the above-described first and second embodiments are substantially the same. That is, the current, which flows to the channel of the MOS transistor 6 (one bit line BL) in the first embodiment is the current Iref similar to that in the above-described second embodiment and the current of Iref×n flows to the entire NAND flash memory.

The value of the peak value is a maximum value allowable for a peripheral device. This is also the maximum value allowable for the sense amplifier 5 when inputting the data from the host. That is, even when the peak current is generated, the peak value generated in the bit line BL is in an allowable range, so that even when there are two peaks in the current, and further when this flows from the time t2 to t4, there is not a problem. That is, the nonvolatile semiconductor storage devices according to the above-described first and second embodiments are configured to inhibit the power consumption and inhibit the charge delay of the bit line BL while inhibiting the peak value of the current, which flows to the bit line BL.

Meanwhile, "first resistance element" specified by claim 2 may include not only resistance element 92 but also wire resistance in BLC driver 7. Similarly, "second resistance element" specified by claim 2 may include not only resistance element 102 but also wire resistance in BLC driver 7. Furthermore, "first resistance element" and "second resistance element" may also include wire resistance connected to gate of MOS transistor 6.

Meanwhile, charging circuits 90 and 100 may be provided to each bit lines. That is, it may have n charging circuits 90 and 100 to n bit lines. In this case, controller 9 controls each charging circuits 90 and 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
   a memory string including a plurality of memory cells which are capable of holding data;
   a bit line connected to a memory cell of the memory string;
   a sense amplifier which applies a voltage to the bit line to read and write the data from and to the memory cells;
   a first MOS transistor electrically connected between the sense amplifier and the bit line;
   a first charging circuit which has a first current supply capacity and transfers a first current to a gate of the first MOS transistor through a first node;
   a second charging circuit which has a second current supply capacity higher than the first current supply capacity and transfers a second current larger than the first current to the gate of the first MOS transistor through the first node; and
   a controller which controls a first timing to switch from the first current to the second current.

2. The device according to claim 1, wherein
   the first charging circuit includes:
   a supply source which supplies a voltage to a second node; and
   a first resistance element electrically connected between the first node and the second node, and
   wherein the second charging circuit includes:
   a supply source which supplies a voltage to a third node; and
   a second resistance element electrically connected between the first node and the third node, with a resistance value smaller than the resistance value of the first resistance element.

3. The device according to claim 1, wherein
   the first charging circuit includes a second MOS transistor which supplies the first current to the first node and in which a ratio of a first gate width to a first gate length is a first ratio, and
   wherein the second charging circuit includes a third MOS transistor which supplies the second current to the first node and in which a ratio of a second gate width to a second gate length is a second ratio larger than the first ratio.

4. The device according to claim 1, wherein
   the first timing at which the controller switches from the first charging circuit to the second charging circuit is, when charging the bit line with the first current output from the first charging circuit, at least after a peak value of a current which flows to the bit line is generated and before a voltage at the gate of the first MOS transistor is saturated.

5. The device according to claim 1, wherein
   a voltage output by the first and second charging circuits to the first node is a sum of a threshold voltage of the first MOS transistor and a voltage applied by the sense amplifier to the bit line.

6. The device according to claim 1, wherein
   the controller controls the first timing on the basis of a capacitance of the gate of the first MOS transistor and the second current supply capacity.

7. The device according to claim 1, wherein
   the first timing at which the controller switches from the first charging circuit to the second charging circuit is the timing before an increase in potential of a word line.

8. The device according to claim 4, wherein
   a potential difference generated between the gate provided on the memory cell and a channel of the memory cell is of a magnitude such that a threshold shift does not occur.

9. A nonvolatile semiconductor storage device, comprising:
   a memory string including a plurality of memory cells each which are capable of holding data are connected in series;
   a bit line connected to the memory cell string;
   a sense amplifier which applies a voltage to the bit line to read and write the data from and to the memory cells;
   a first MOS transistor electrically connected between the sense amplifier and the bit line; and
   a clamp circuit supplying a first current to a gate of the first MOS transistor through a first node;
   wherein the clamp circuit includes:
   a second MOS transistor one end of a current pathway of which is connected to a signal line and to the other end and a gate of which a first voltage is supplied; and
   a comparator which compares a potential of the gate with a potential of an output end and outputs a comparison result to the first node.

10. The device according to claim 9, wherein
    the first MOS transistor and the second MOS transistor are formed in the same process, and
    the signal line and the bit line are formed in the same process.

11. The device according to claim 10, wherein
    the first MOS transistor and the second MOS transistor form a current mirror circuit.

12. The device according to claim 9, wherein
    a minimum value of an input voltage range of the comparator is set to 0 V or lower, and a maximum value of an output voltage range is a value larger than the first voltage.

13. The device according to claim 12, wherein
    the comparator comprises a third MOS transistor to which the potential of the gate of the second MOS transistor is supplied, and
    wherein the third MOS transistor is a depression n-channel MOS transistor.

14. A nonvolatile semiconductor storage device, comprising:
- a plurality of memory strings including a plurality of memory cells each capable of holding data;
- a plurality of bit lines each connected to one of the memory cells of the memory strings;
- sense amplifiers each of which applies a voltage to the bit lines to read and write the data from and to the memory cells;
- a plurality of first MOS transistors electrically connected between sense amplifiers and bit lines; and
- a clamp circuit supplying a first current to gates of the first MOS transistors through a first node,
- wherein the clamp circuit includes:
- a second MOS transistor one end of a current pathway of which is connected to a signal line, to the other end and a gate of which a first voltage is supplied, and a potential of the gate of which is output to the first node.

15. The device according to claim 14, wherein
the first MOS transistors and the second MOS transistor are formed in the same process, and the signal line and the bit line are formed in the same process.

16. The device according to claim 15, wherein
the first MOS transistor and the second MOS transistor form a current mirror circuit.

17. The device according to claim 14, wherein
a minimum value of an input voltage range of the comparator is set to 0 V or lower and a maximum value of an output voltage range is a value larger than the first voltage.

18. The device according to claim 17, wherein
the comparator includes a third MOS transistor to which the potential of the gate of the second MOS transistor is supplied, wherein
the third MOS transistor is a depression n-channel MOS transistor.

19. The device according to claim 17, wherein
the clamp circuit includes a plurality of clamp units corresponding to the plurality of bit lines, and
the controller controls the plurality of clamp units.

* * * * *